(12) United States Patent
Mine et al.

(10) Patent No.: US 11,309,110 B2
(45) Date of Patent: Apr. 19, 2022

(54) SYSTEMS AND METHODS FOR COOLING A SUPERCONDUCTING SWITCH USING DUAL COOLING PATHS

(71) Applicant: General Electric Company, Schenectady, NY (US)

(72) Inventors: Susumu Mine, Niskayuna, NY (US); Ye Bai, Niskayuna, NY (US); Anbo Wu, Clifton Park, NY (US); Minfeng Xu, Ballston Lake, NY (US); Paul St. Mark Shadforth Thompson, Stephentown, NY (US)

(73) Assignee: General Electric Company, Schenectady, NY (US)

( * ) Notice: Subject to any disclaimer, the term of this patent is extended or adjusted under 35 U.S.C. 154(b) by 124 days.

(21) Appl. No.: 16/289,182

(22) Filed: Feb. 28, 2019

(65) Prior Publication Data

US 2020/0279680 A1 Sep. 3, 2020

(51) Int. Cl.
*H01F 6/04* (2006.01)
*G01R 33/3815* (2006.01)
*H01F 6/00* (2006.01)

(52) U.S. Cl.
CPC .......... *H01F 6/04* (2013.01); *G01R 33/3815* (2013.01); *H01F 6/008* (2013.01)

(58) Field of Classification Search
CPC ....................................................... H01F 6/04
See application file for complete search history.

(56) References Cited

U.S. PATENT DOCUMENTS 6,107,905 A * 8/2000 Itoh ................... F17C 3/085
335/216
7,383,688 B2 6/2008 Van Hasselt et al.
(Continued)

FOREIGN PATENT DOCUMENTS

EP 3163222 B1 7/2018
JP 2004235653 A 8/2004

OTHER PUBLICATIONS

Dobrin et al., "A 4 T HTS Magnetic Field Generator, Conduction Cooled, for Neutron Physics Spectrometry", IEEE Transactions on Applied Superconductivity, vol. 26, Issue: 3, pp. 1-4, Apr. 2016.
(Continued)

*Primary Examiner* — Alexander Talpalatski
(74) *Attorney, Agent, or Firm* — Dority & Manning, P.A.

(57) ABSTRACT

A persistent current switch system is presented. One embodiment of the persistent current switch system includes a vacuum chamber having a winding unit and dual cooling paths. The dual cooling paths are configured to circulate a coolant flow. The dual cooling paths are defined by a first cooling path and a second cooling path. The first cooling path includes a solid thermal component disposed in direct contact with the winding unit and the second cooling path includes a cooling tube disposed in direct contact with the winding unit and configured to circulate a coolant therein. The dual cooling paths cool the temperature of the winding unit below the threshold temperature to transition the persistent current switch system from the first mode to the second mode. A method of for cooling a winding unit in a persistent current switch system and a switching system including dual cooling paths are also disclosed.

15 Claims, 5 Drawing Sheets

(56) References Cited

U.S. PATENT DOCUMENTS

| | | |
|---|---|---|
| 7,509,815 B2 | 3/2009 | Van Hasselt |
| 7,994,664 B2 | 8/2011 | Ackermann et al. |
| 8,676,282 B2 | 3/2014 | Jiang et al. |
| 8,885,329 B2 | 11/2014 | Akhmetov |
| 8,922,308 B2 | 12/2014 | Stautner |
| 9,396,855 B2 | 7/2016 | Tamura |
| 9,575,149 B2 | 2/2017 | Lvovsky et al. |
| 9,620,272 B2 | 4/2017 | Nakayama |
| 10,107,879 B2 | 10/2018 | Jonas et al. |
| 2006/0135370 A1 | 6/2006 | Hasselt |
| 2013/0160975 A1* | 6/2013 | Stautner ............... F28D 15/00 165/104.22 |
| 2015/0323626 A1* | 11/2015 | Jonas ................ G01R 33/3804 324/322 |
| 2016/0187435 A1* | 6/2016 | Jiang ................ G01R 33/3804 324/322 |
| 2016/0189842 A1* | 6/2016 | Jonas ..................... H01F 6/04 335/216 |
| 2016/0276082 A1 | 9/2016 | Ackermann et al. |

OTHER PUBLICATIONS

EPO Search Report, dated Jul. 16, 2020.

\* cited by examiner

SYSTEMS AND METHODS FOR COOLING A SUPERCONDUCTING SWITCH USING DUAL COOLING PATHS

BACKGROUND

The disclosure relates generally to superconducting systems and more specifically to systems and methods for cooling a persistent current switch when operating between a resistive mode and a superconductive mode in a cryogenic environment.

Superconducting magnets are used in various apparatus such as, but not limited to, superconducting electric generators and motors, magnetic resonance imaging (MRI) systems for medical diagnosis, magnetic levitation devices for train transportation and nuclear fusion.

A superconducting magnet is used to produce a magnetic field in the superconducting apparatus. In some methods, an electric current from a power source is constantly applied to the superconducting magnet to produce the magnetic field. However, production of such a strong magnetic field entails a constant supply of the electric current in a range of hundreds of amperes. This constant supply of electric current to the superconducting magnet increases the running cost of the superconducting apparatus.

On the other hand, in certain other techniques, the superconducting magnet is excited to operate in a persistent current mode, where the electric current persistently flows in a superconducting loop without any current supply from the power source. Initially, an external power supply is used to energize the magnetic field of one or more superconducting electrically conductive coils. After the desired magnetic field is obtained and the power supply is disconnected from the magnet, the magnet maintains the current and the magnetic field by a persistent current switch, which is coupled in parallel to the superconducting magnet and the power source. The persistent current switch is alternatingly switched from a normal state to a superconducting state to operate the superconducting magnet in the persistent current mode. These techniques are widely used in magnetic devices, such as superconducting electric generators, motors and MRI systems. However, while operating the persistent current switch in the normal state, an amount of heat is produced at the persistent current switch. It is desirable to optimally dissipate this heat from the persistent current switch to transition the switch from the normal state to the superconducting state without high boil-off of cryogen in the superconducting system.

In a conventional system, a superconducting magnet is housed in a helium vessel containing about 2000 liters of liquid helium (He). Further, the persistent current switch is fitted around the superconducting magnet with the persistent current switch immersed in this helium vessel. Since this arrangement employs a large vessel with thousands of liters of liquid He, the arrangement is not only expensive to manufacture, but also heavy to transport and install at a desired location, e.g., diagnostic centers. Additionally, the refill of thousands of liters of liquid He for delivery to remote locations after completing the ride through to the customer, may be inconvenient.

Moreover, the liquid He in these systems can sometimes boil-off during a quench event. The boiled-off helium escapes from the cryogen bath in which the magnetic coils are immersed. Thus, each quench event is followed by re-filling of the liquid He and re-ramping of the magnet, which is an expensive and time consuming event.

On the other hand, the conduction cooling magnet system needs less helium inventory than the conventional system. However, when the persistent current switch body is in a switch-OFF state (normal state), the designed temperature is high, and thus the cooling time from switch-OFF state to switch-ON state (superconducting state) becomes longer. This long cooling time is not preferable for system operation. To reduce the cool-down time, one may increase the conductance of the heat conduction path, however this will conduct excessive heat to the cryogenic tank when the switch is in the switch-OFF state (and higher temperature) for superconducting coil ramp. During ramp-up of the superconducting coil, excessive heat conduction from the persistent current switch may consume all the stored liquid cryogen (e.g. liquid helium) before completing the ramp-up.

Accordingly, there is a need for a superconducting switch and method of cooling that provides an increased rate of cooling of the switch, increased system reliability and reduce system thermal instability.

BRIEF DESCRIPTION

Aspects and advantages of the disclosure are set forth below in the following description, or may be obvious from the description, or may be learned through practice of the disclosure.

Briefly in accordance with one aspect of the present technique, a persistent current switch system is presented. The persistent current switch includes a vacuum chamber, a winding unit disposed in the vacuum chamber, a first cooling path and a second cooling path. The winding unit is configured to switch the persistent current switch system from a first mode to a second mode when a temperature associated with the winding unit is below a threshold temperature. The first cooling path comprises a solid thermal component in direct contact with the winding unit/ The second cooling path comprises a cooling tube disposed in direct contact with the winding unit and configured to circulate a coolant therein. The first cooling path and the second cooling path defining dual cooling paths to cool the temperature of the winding unit below the threshold temperature to transition the persistent current switch system from the first mode to the second mode.

In accordance with further aspects of the present technique, a method for cooling a winding unit in a persistent current switch. The method includes disposing a winding unit and dual cooling paths within a vacuum chamber, switching the persistent current switch system from a first mode to a second mode by reducing a temperature of the winding unit below the threshold temperature and transitioning the persistent current switch system from the second mode to the first mode by halting the circulation of the coolant in the cooling tube, thus increasing the temperature of the winding unit above the threshold temperature. The winding unit is thermally coupled to the dual cooling paths. The dual cooling paths comprise a first cooling path and a second cooling path. The first cooling path comprises a solid thermal component directly connected to the winding unit. The second cooling path comprises a cooling tube directly connected to the winding unit and having a coolant disposed therein. The temperature is reduced below the threshold temperature by circulating the coolant in the cooling tube and by direct cooling with the solid thermal component to remove heat from the winding unit In accordance with another aspect of the present technique, a switching system is presented. The switching system includes a persistent current switch including a persistent current switch system and a superconducting magnet coupled to the persistent current switch system, wherein the superconducting magnet is configured to generate a magnetic field based on the switching. The persistent current switch is disposed in a low magnetic field region and configured to alternatingly switch between a first mode and a second mode. The persistent current switch comprises a vacuum chamber, a winding unit disposed in the vacuum chamber, a first cooling path and a second cooling path. The winding unit is configured to switch the persistent current switch system from a first mode to a second mode when a temperature associated with the winding unit is below a threshold temperature. The first cooling path comprises a solid thermal component disposed in direct contact with the winding unit. The second cooling path comprises a cooling tube disposed in direct contact with the winding unit and configured to circulate a coolant therein. The first cooling path and the second cooling path defining dual cooling paths to cool the temperature of the winding unit below the threshold temperature to transition the persistent current switch system from the first mode to the second mode.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure, including the best mode thereof to one skilled in the art, is set forth more particularly in the remainder of the specification, including reference to the accompanying figures, in which.

Corresponding reference characters indicate corresponding parts throughout the several views of the drawings.

DETAILED DESCRIPTION OF THE DISCLOSURE

Figure 1:
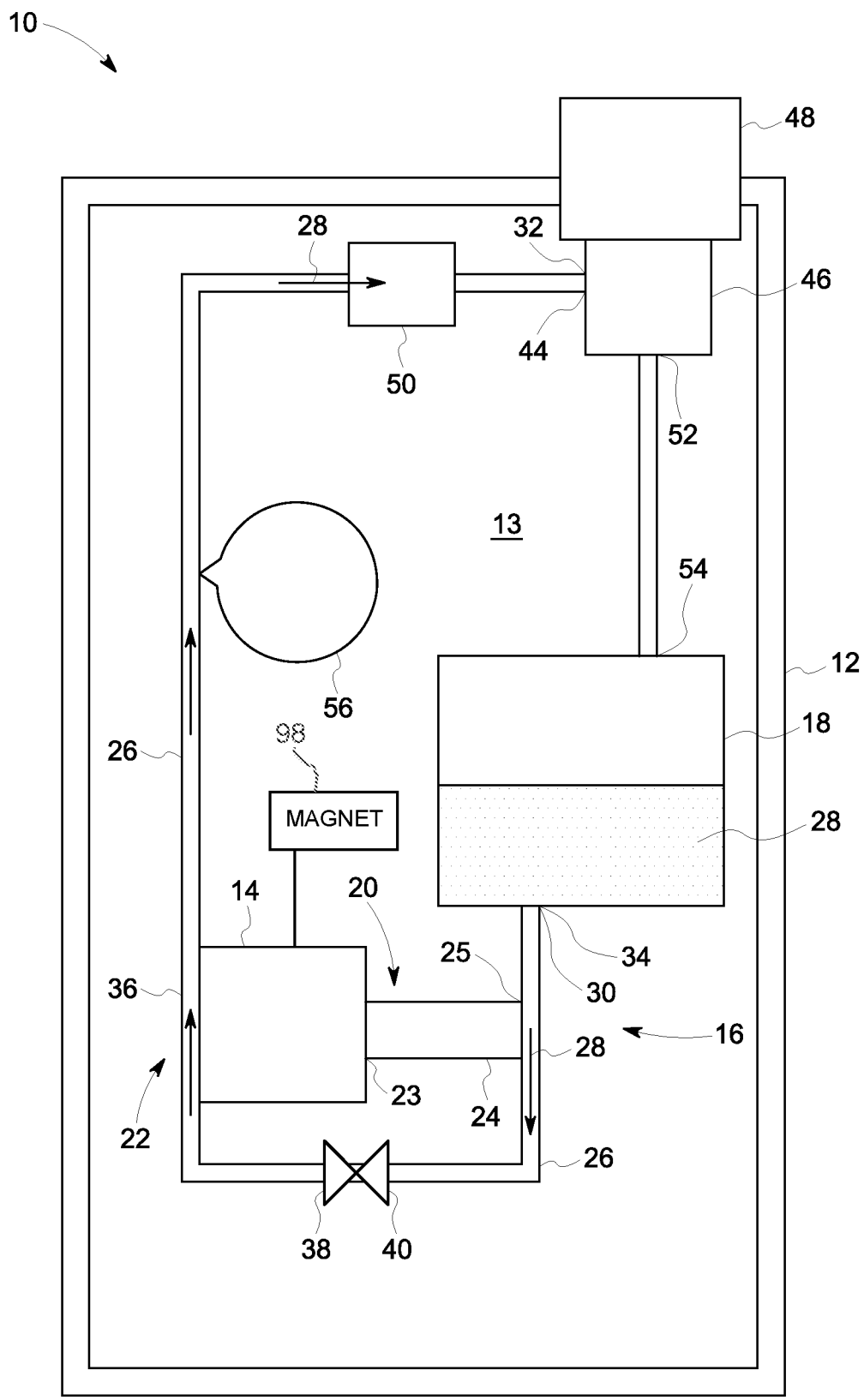
FIG. 1 is a schematic cross-sectional side view of a persistent current switch system including dual cooling paths, in accordance with one or more embodiments of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Embodiments of the present disclosure provide for a superconducting switch having an increased rate of cooling. In particular, embodiments of the present disclosure provide for a superconducting switch system, and more particularly, a persistent current switch that utilizes dual cooling paths to provide an increased rate of cooling of the persistent current switch.

Each example is provided by way of explanation of the disclosure, not limitation of the disclosure. In fact, it will be apparent to those skilled in the art that modifications and variations can be made in the present disclosure without departing from the scope or spirit thereof. For instance, features illustrated or described as part of one embodiment may be used on another embodiment to yield a still further embodiment. Thus, it is intended that the present disclosure covers such modifications and variations as come within the scope of the appended claims and their equivalents. Although exemplary embodiments of the present disclosure will be described generally in the context of superconducting generators and motors, for purposes of illustration, one of ordinary skill in the art will readily appreciate that embodiments of the present disclosure may be used in combination with any components for heating and/or cooling, such as those associated with CT scanners, MRI system, or the like, and is not intended to be limiting to a cooling implementation with superconducting components.

As will be described in detail hereinafter, various embodiments of an exemplary persistent current switch system including dual cooling paths and methods for cooling the persistent current switch to alternatingly switch between a first mode and a second mode are presented. By employing the methods and the various embodiments of the persistent current switch and switch system described hereinafter, size of the magnetic devices, cost of manufacturing, cost of installing, cooling time to achieve switching and cost of running the magnetic devices may be substantially reduced.

Turning now to the drawings, and referring to FIG. 1, a cross-sectional side view of a persistent current switch system 10, in accordance with aspects of the present technique, is depicted. The persistent current switch system 10 may be configured to alternatingly switch between a first mode and a second mode. The first mode may be representative of a normal state where a persistent current switch winding unit (described presently) provides high electrical resistance. Similarly, the second mode may be representative of a superconducting state where the persistent current switch winding unit provides zero electrical resistance. It may be noted that the terms "normal state", "resistive state" and "first mode" are used interchangeably and the terms "superconducting state" and "second mode" are used interchangeably. The persistent current switch system 10 is typically employed to operate a superconducting magnet 98 in a persistent current mode.

In a presently contemplated configuration, the persistent current switch system 10 includes a vacuum chamber 12, a winding unit 14, also referred to herein as a "switch", dual cooling paths 16 and a reservoir 18. The vacuum chamber 12 may be disposed as a unit in a magnetic device, such as a superconducting generator or motor. The vacuum chamber 12 has defined therein a vacuum space 13. It may be noted that the implementation of the persistent current switch system 10 is not limited to this implementation, and may be implemented in other devices, such as other types of superconducting electrical machines, superconducting magnet energy storage systems, MRI systems and the like. In one embodiment the vacuum chamber/environment may already exist in the system and the magnet and the persistent current switch system may be implemented in the existing vacuum environment.

During operation, and optionally with the aid of a heater (not show), the temperature of the winding unit 14 is heated above a threshold temperature. The threshold temperature may be representative to as a critical design temperature of the winding unit 14, above which the winding unit 14 is transitioned from the superconducting state to the normal or resistive state.

In a presently contemplated configuration, the persistent current switch system 10 is configured to alternatingly switch the winding unit 14 the between the normal state and the superconducting state. In an exemplary embodiment, the winding unit 14 may be a wire like structure that is wound over the outer circumference of a bobbin, or the like. In one embodiment, the winding unit 14 may be wound bifilar over the bobbin to minimize inductance of the winding unit 14.

The winding unit 14 and the dual cooling paths are disposed therein the vacuum chamber 12, and more particularly within the vacuum space 13. The dual cooling paths 16 are configured to cool the winding unit 14 below the threshold temperature. To provide such cooling, the dual cooling paths 16 are thermally coupled to the winding unit 14 and configured to cool the temperature of the winding unit 14 below the threshold temperature ($T_c$) to transition the winding unit 14 from the first mode to the second mode. The dual cooling paths 16 are comprised of a first cooling path 20 and a second cooling path 22. The first cooling path 20 is configured as a solid cooling path, wherein a solid thermal component 24 is thermally coupled to both the winding unit 14 and a cooling tube 26. More particularly, the solid thermal component 24 is in direct contact with both the winding unit 14 and a cooling tube 26. In an embodiment, a first end 23 of the solid thermal component 24 is in direct contact with the winding unit 14 and an opposed second end 25 of the solid thermal component 24 is in direct contact with the cooling tube 26. The second cooling path 22, in contrast to the first cooling path 20, does not employ a solid thermal component, and is configured as a tube cooling path that provides the cooling tube 26 to be thermally coupled to the winding unit 14, and more particularly, the cooling tube 26 to be in direct contact with the winding unit 14.

During the switch cooling process (described presently), the cooling tube 26 is configured to circulate a coolant 28 therein. The coolant 28 may include liquid helium LHe, liquid hydrogen ($LH_2$), liquid neon (LNe) or liquid nitrogen ($LN_2$). In one embodiment, the winding unit 14 may be a low temperature superconductor, a medium temperature superconductor, or a high temperature superconductor. Also, the coolant may be selected based on the type of superconductor used for the winding unit 14. For example, the persistent current switch system having a low temperature superconductor may employ liquid helium (LHe) as the coolant. Similarly, for a medium temperature superconductor, LHe, liquid neon (LNe), or liquid hydrogen ($LH_2$) may be used as the coolant. Furthermore, for a high temperature superconductor, LNe or liquid nitrogen ($LN_2$) may be used as the coolant in the system.

As previously indicated, in an exemplary embodiment, the dual cooling paths 16 are configured to reduce a temperature of the winding unit 14 below the threshold temperature, at an accelerated speed that is faster than the speed at which cooling is achieved by using only a single cooling path. In accordance with an embodiment, the solid thermal component 24 of the first cooling path 20 may be any thermally conductive component, such as a metal sheet, rod or bar. In an embodiment, the solid thermal component 24 may be a brass, aluminum, and/or copper sheet, rod or bar, for example. As previously described, the solid thermal component 24 is in direct contact with the winding unit 14 and the cooling tube 26. The solid thermal component 25 provides for the conduction of heat from the winding unit 14 to the coolant 28 in the cooling tube 26. As previously described, the winding unit 14 is in direct contact with the cooling tube 26 and provides for the conduction of heat from the winding unit 14 to the coolant 28 in the cooling tube 26.

The cooling tube 26 may include an inlet 30 at one end and an outlet 32 at the other end of the cooling tube 26. Further, the inlet 30 is operatively coupled to an outlet 34 of the reservoir 18. It may be noted that the terms "reservoir" and "coolant reservoir" may be used interchangeably. The inlet 30 is configured to receive the coolant 28 from the reservoir 18. The cooling tube 26 defines a channel 36 therein that operatively couples the cooling tube 26 and the reservoir 18 to convey the coolant 28 from the reservoir 18 through the cooling tube 26 for cooling of the winding unit 14. A flow control component 38 is disposed along the cooling tube 26 to regulate the flow of coolant 28 from the reservoir 18 through the cooling tube 26. In one embodiment, the flow control component 40 is a cryogenic valve 40, such as a latching valve, capable of controlling the flow of coolant 28 within the cooling tube 26, and thus the rate of heat removal from the winding unit 14. In an embodiment, the cryogenic valve 40 does not generate heat except momentary heat during valve state change between an open and closed state and vice versa. In one embodiment, the inlet 30 of the cooling tube 26 is configured to receive the coolant 28 from the reservoir 18 when the winding unit 14 is turned ON (superconducting state). The reservoir 18 may also be referred to as a storage unit for storing and/or condensing the coolant 28. In certain embodiments, the reservoir 18 may include a release valve (not shown). The release valve may be configured to aid in controlling any pressure build-up within the reservoir 18. The release valve may be configured to automatically and/or manually release any pressure build-up within the reservoir 18.

In a similar manner, the cooling tube 26 is operatively coupled to an inlet 44 of a recondenser 46 and is configured to convey evaporated coolant 28 from the cooling tube 26 to the reservoir 18. In the illustrated embodiment, the recondenser 46 is coupled to a cryocooler 48. An outlet 52 of the recondenser is coupled to the reservoir 18. The outlet 32 of the cooling tube 26 is configured to convey the evaporated coolant 28 from the cooling tube 26 to the reservoir 18, via the recondenser 46, when the winding unit 14 is turned OFF (normal state).

The superconducting (SC) switch, and more particularly, the winding unit 14, typically operates at temperature well above the critical temperature, e.g. 50K-60K, in a resistive state during a magnet ramp process. After the magnet is energized to full current, and opening of the flow control component 38, the winding unit 14 is cooled (to a superconducting state). During this cooling process, the coolant 28 will be vaporized and heated before it returns to the cryocooler reservoir 18. To minimize the potential effect of the heated coolant 28 on the cooling tube 26 and the winding unit 14, an optional buffer mass (such as copper block, copper and epoxy resin composite material, or the like) 50 and/or an optional evaporated gas buffer tank 56 is thermally attached to the return path of the cooling tube 26, to cool the evaporated coolant 28 and reduce its impact to the overall cooling system. In the embodiment of FIG. 1, the optional buffer mass 50 is disposed between the winding unit 14 and the recondenser 46, to avoid heating up the recondenser 46 too quickly when the flow control component 38 is open for switch cooling. In another embodiment the returning gas, and more particularly, the evaporated coolant 28, may enter the evaporated gas buffer tank 56 disposed between the winding unit 14 and the recondenser 46.

As previously noted, in a conventional bath-cooled system, the persistent current switch is typically immersed in the coolant vessel containing liquid He. While cooling the switch, the liquid He is evaporated and may be vented out of the system to an external environment. Further, to compensate for this vented liquid He, the coolant vessel is re-filled with a new liquid He, which is an expensive and time consuming event. In addition, this arrangement requires liters of liquid He to re-fill the coolant vessel. Some or all of these shortcomings of the currently available persistent current switches may be circumvented via use of embodiments consistent with the example persistent current switch system 10 that incorporates the disclosed dual cooling paths 16.

In accordance with aspects of the present technique, the evaporated coolant 28 from the cooling tube 26 is conveyed to the recondenser 46, where the evaporated coolant 28 is re-condensed and conveyed back to the reservoir 18 and ultimately the cooling tube 26. This re-condensation or recirculation of the evaporated coolant 28 substantially minimizes or in some situations eliminates the need for refilling of the coolant reservoir 18, which in turn reduces size and weight of the reservoir 18. Also, since the coolant is re-condensed and used again in the cooling tube 26, use of liters of coolant in systems may be circumvented. This in turn reduces the manufacturing cost and the weight of the systems.

It may be noted that the persistent current switch system 10 is assumed to be operating in the normal state at the beginning. The normal state is representative of a state where the winding unit 14 provides high electrical resistance to a superconducting magnet. Also, to operate the persistent current switch system 10 in the normal state, the temperature of the winding unit 14 is maintained above the threshold temperature.

To switch the persistent current switch system 10 from the normal state to the superconducting state, the winding unit 14, and more particularly, an optional associated heating unit (not shown), is de-energized or turned OFF and the cooling tube 26 is filled with the coolant 28 received from the reservoir 18. The coolant 28 is circulated in the cooling tube 26 to maintain and/or reduce the temperature of the winding unit 14 below the threshold temperature or the critical temperature via the first cooling path 20 and the second cooling path 22. During the cooling process, the cooling tube 26 is in direct thermal contact with the solid thermal component 24 and the winding unit 14 and provides absorption of heat from the winding unit 14 via the dual cooling paths 16. If the temperature of the winding unit 14 is below the threshold temperature, the winding unit 14 switches from the normal state to the superconducting state. As previously noted, the superconducting state may be representative of a state where the winding unit 14 provides zero resistance to the superconducting magnet. This zero resistance of the winding unit 14 helps to form a persistent loop with electric current circulating between the winding unit 14 and the superconducting magnet, without any further current supply from a power source (not shown in FIG. 1). In one embodiment, when the persistent current switch system 10 is operating in the superconducting state, it may be noted that the external heat load on the persistent current switch system 10 is relatively small. The source of external heat load may include thermal radiation. This small heat load can be further reduced using MLI-expand multilayer insulation around the persistent current switch system 10. In another embodiment, the persistent current switch system 10 may be a stand-alone entity with its own reservoir and can be placed anywhere around the superconducting magnet in the vacuum space 13.

Typically, the persistent current switch system 10 operates in the superconducting state if the temperature of the winding unit 14 is below the threshold temperature. Otherwise, the persistent current switch system 10 operates in the normal state. To switch the persistent current switch system 10 from the superconducting state to the normal state, the flow control component 38 fluidically disposed in the cooling tube 26 is closed. The flow control component 38 is designed to block or choke the flow of the coolant 28 from the reservoir 18 through the cooling tube 26, and also to prevent back-flow of the coolant 28 from the cooling tube 26 to the reservoir 18. During operation or heating of the winding unit 14, the temperature of the winding unit 14 is enhanced or increased above the threshold temperature. This increased temperature of the winding unit 14 causes the persistent current switch system 10 to transition from the superconducting state to the normal state.

During the transition of the persistent current switch system 10, and more particularly, the winding unit 14, to the normal state the evaporated coolant 28 is conveyed out of the cooling tube 26 via the cooling tube outlet 32 to the reservoir 18 via the inlet 44 and an outlet 52 of the recondenser 46 and an inlet 54 of the reservoir. In one embodiment, a density difference of the cryogen, such as the coolant 28 may be employed to drive the evaporated coolant 28 out of the cooling tube 26 to the reservoir 18 via the recondenser 46. Subsequent to re-condensing in the recondenser 48, the re-condensed coolant 28 is stored in the reservoir 18. During the switching of the persistent current switch system 10, and more particularly, the winding unit 14, from the normal state to the superconducting state, this re-condensed coolant is circulated back to the cooling tube 26.

Thus, by employing the persistent current switch system 10 of FIG. 1, the coolant 28 in the cooling tube 26 is efficiently utilized when used in systems with low cryogen volume in a vacuum environment and provides additional cooling beyond systems utilizing only single cooling path, such as a solid thermal component. In addition, since the persistent current switch system 10 has its own cryogenic environment or dual path cooling system, the persistent current switch system 10 may be used as a stand-alone entity. More specifically, the persistent current switch system 10 may be placed proximate to the superconducting magnet or may conveniently be disposed at a distance from the superconducting magnet in a low-magnetic field region. The exemplary persistent current switch system 10 allows an improvement over response time from known systems, while alternatingly switching between the normal state and the superconducting state. The persistent current switch system 10 is configured to switch from the normal state to the superconducting state within a time period in a range of about 1 minutes to about 15 minutes (See FIG. 4). In one embodiment, the persistent current switch system 10, and more particularly, the winding unit 14, may be disposed in a horizontal position, a vertical position, or an inclined position on the superconducting magnet.

Figure 2:
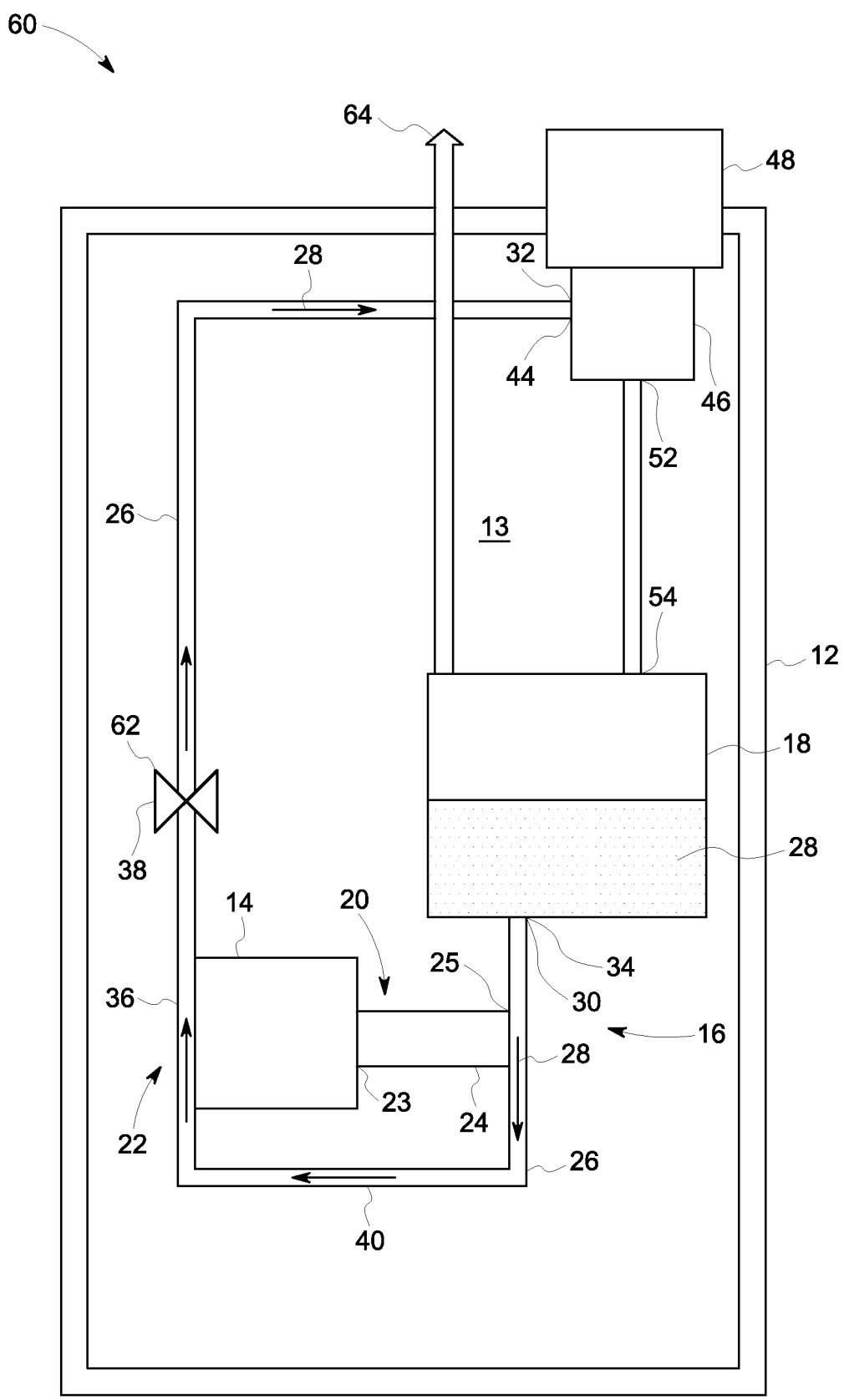
FIG. 2 is a schematic cross-sectional side view of a persistent current switch system including dual cooling paths, in accordance with one or more embodiments of the present disclosure.

Referring to FIG. 2, a cross-sectional view of a persistent current switch system 60, in accordance with another embodiment of the present technique, is depicted. The embodiment of FIG. 2 is similar to the embodiment of FIG. 1, except that the flow control device 38 is configured as an orifice flow restrictor 62 disposed in fluid communication with the cooling tube 26 to regulate the flow of coolant 28 from the reservoir 18 through the cooling tube 26. In addition, the flow control device 38 is disposed in the cooling tube 26 between the winding unit 14 and the recondenser 46. In addition, as previously alluded to, the reservoir may also include a release valve 64 that is used to release any pressure that is built-up within the reservoir 18. In the embodiment depicted in FIG. 2, the orifice flow restrictor 62 serves as a flow restrictor within the cooling tube 26 to the coolant 28 flowing therethrough. It should be understood that alternate types of flow control components beyond the cryogenic latching valve and the orifice flow restrictor are anticipated herein, such as, but not limited to long stem cryogenic valves.

In a presently contemplated configuration, the persistent current switch system 60 includes a vacuum chamber 12, a winding unit 14, a reservoir 18 and dual cooling paths 16. The dual cooling paths 16, comprised of a first cooling path 20 and a second cooling path 22, are configured to reduce the temperature of the winding unit 14 below a threshold temperature, as previously described. The cooling tube 26 includes an inlet 30 and an outlet 32. The inlet 30 is configured to receive a coolant 28 from the reservoir 18 via a channel 36 defined within the cooling tube 26, and the outlet 32 is configured to convey the evaporated coolant from the cooling tube 26 to the reservoir 18. In addition, the flow control component 38 is disposed in fluid communication with the channel 36 to regulate the flow of coolant 28 from the reservoir 18 through the cooling tube 26.

In accordance with aspects of the present technique, the persistent current switch system 60, and more particularly, the winding unit 14, is configured to alternatingly switch between a normal state and a superconducting state. As previously described with reference to FIG. 1, by employing the persistent current switch system 60 of FIG. 2, the coolant 28 in the cooling tube 26 is efficiently utilized when used in systems with low cryogen volume in a vacuum environment and provides additional cooling beyond systems utilizing only single cooling path, such as a solid thermal component.

Figure 3:
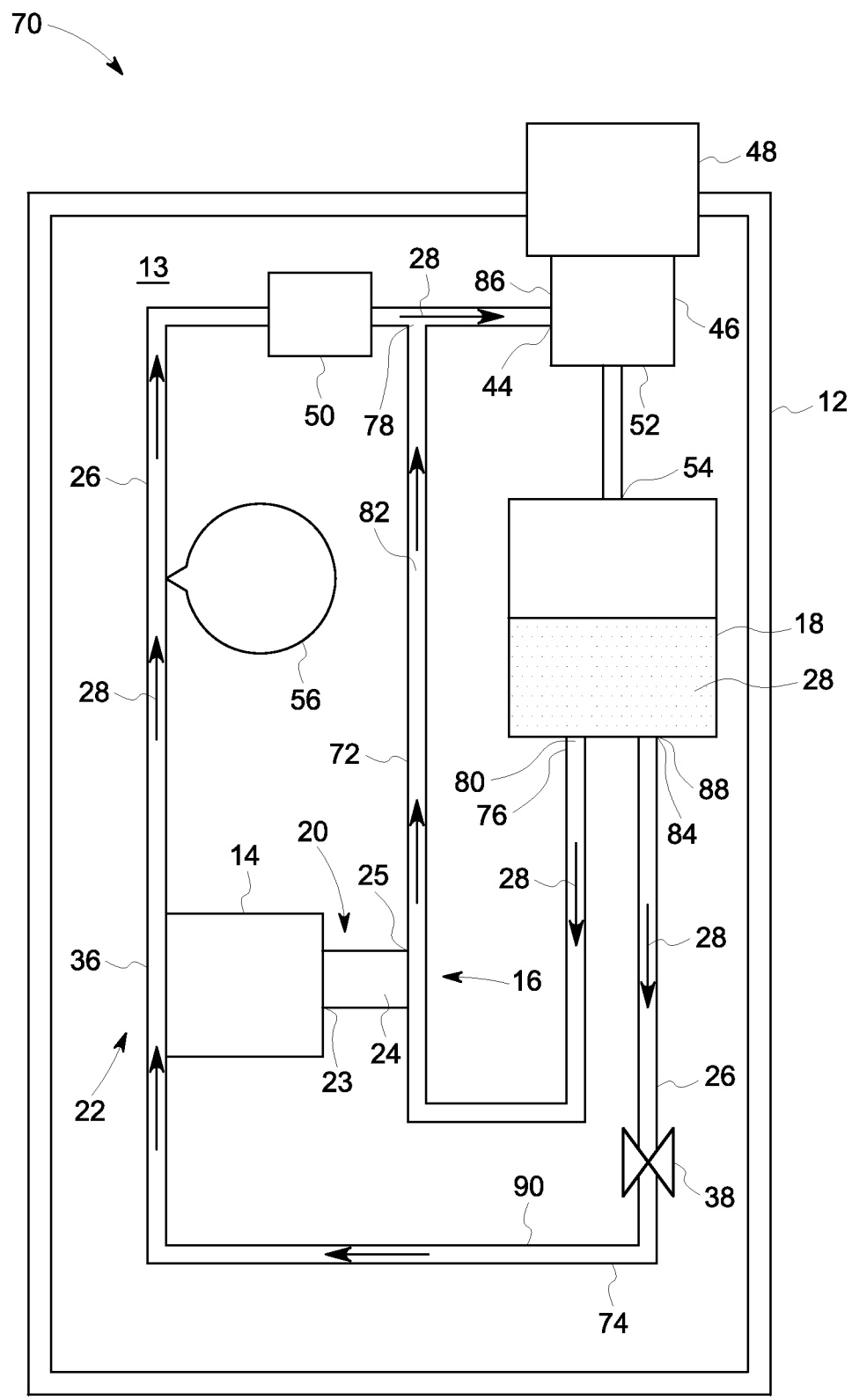
FIG. 3 is a schematic cross-sectional side view of a persistent current switch system including dual cooling paths, in accordance with one or more embodiments of the present disclosure.

Turning now to FIG. 3, a cross-sectional side view of a persistent current switch system 70, in accordance with yet another embodiment of the present technique, is depicted. The embodiment of FIG. 3 is similar to the embodiment of FIG. 1, except while the dual cooling paths 16 of FIG. 1 employ a solid thermal component 24 of the first cooling path 20 coupled to the same cooling tube 26 of the second cooling path 22, in the embodiment of FIG. 3, a first cooling tube 72 is in direct contact with a solid thermal component 24 for the removal of heat from the winding unit 14, and a second cooling tube 74 is positioned in direct contact with the winding unit 14 and provides for the removal of heat from the winding unit 14. A coolant 28 flows through a channel formed in each of the first and second cooling tubes 72, 74. It should be noted in the embodiment of FIG. 3, the coolant 28 in the first cooling tube 72 is output at an outlet 78 into the second cooling tube 74 prior to reaching the recondenser 46. In an alternate embodiment, the coolant 28 in the first cooling tube 72 may be output from outlet 78 directly into an inlet (not shown) of the recondenser 46.

Further, the persistent current switch system 70 also includes a winding unit 14 and a reservoir 18, which are arranged and operated in a manner that is substantially similar to the persistent current switch system 10 of FIG. 1.

Similar to the previously disclosed embodiments, the dual cooling paths 16 are configured to reduce a temperature of the winding unit 14 below the threshold temperature in a shorter amount of time than the use of a single cooling path. In accordance with an embodiment, the solid thermal component 24 of the first cooling path 20 may be any thermally conductive component, such as metal sheet, rod or bar. The solid thermal component 24 may be a brass, aluminum, and/or copper sheet, rod or bar, for example. The solid thermal component 24 is in direct contact with the winding unit 14 and the first cooling tube 72. The solid thermal component 25 provides for the conduction of heat from the winding unit 14 to the coolant 28 in the first cooling tube 72.

The first cooling tube 72 may include an inlet 76 at one end and the outlet 78 at the other end of the cooling tube 72. Further, the inlet 76 is operatively coupled to an outlet 80 of the reservoir 18. The inlet 76 is configured to receive the coolant 28 from the reservoir 18. The first cooling tube 72 defines a channel 82 therein that operatively couples the first cooling tube 72 and the reservoir 18 to convey the coolant 28 from the reservoir 18 through the first cooling tube 72 for cooling of the winding unit 14 via the solid thermal component 24.

The second cooling tube 74 is positioned in direct contact with the winding unit 14 and provides for the removal of heat from the winding unit 14. The second cooling tube 74 may include an inlet 84 at one end and an outlet 86 at the other end of the second cooling tube 74. Further, the inlet 84 is operatively coupled to an outlet 88 of the reservoir 18. The inlet 84 is configured to receive the coolant 28 from the reservoir 18. The second cooling tube 74 defines a channel 90 therein that operatively couples the second cooling tube 74 and the reservoir 18 to convey the coolant 28 from the reservoir 18 through the second cooling tube 74 for cooling of the winding unit 14.

A flow control component 38 is disposed along the second cooling tube 74 to regulate the flow of coolant 28 from the reservoir 18 through the second cooling tube 74. In one embodiment, the flow control component 38 is a cryogenic valve 40 capable of controlling the flow of coolant 28 within the second cooling tube 74, and thus the rate of heat removal from the winding unit 14. In an alternate embodiment, one or more additional flow control components may be disposed in fluid communication with the first cooling tube 72 to control the flow of the coolant 28 therethrough.

In one embodiment, the inlets 76, 84 of the first and second cooling tubes 72,74, respectively, are configured to receive the coolant 28 from the reservoir 18 when the persistent current switch system 70 is de-energized or turned OFF (superconducting state).

The first and second cooling tubes 72,74 are operatively coupled to an inlet 44 of a recondenser 46 and are configured to convey evaporated coolant 28 from the first and second cooling tubes 72,74 to the reservoir 18. In the illustrated embodiment, the recondenser 46 is coupled to a cryocooler 48. The outlets 78, 86 of the first and second cooling tubes 72,74, respectively, are configured to convey the evaporated coolant 28 from a respective cooling tube 72, 74 to the reservoir 18 when the persistent current switch system 70, and more particularly, the winding unit 14, is energized or turned ON.

Moreover, in accordance with aspects of the present technique, the winding unit 14 is configured to alternatingly switch the persistent current switch system 70 between a normal state and a superconducting state. The coolant 28 in the first and second cooling tubes 72,74 absorbs the heat generated by the winding unit 14. Consequent to the absorption of the heat by the coolant 28, the winding unit 14 is cooled and the temperature of the winding unit 14 drops below the threshold temperature. This drop in temperature aids in switching the winding unit 14 from the normal state to the superconducting state. As previously described with reference to FIG. 1, by employing the persistent current switch system 70 of FIG. 3, the coolant 28 in the first and second cooling tubes 72,74 is efficiently utilized when used in systems with low cryogen volume in a vacuum environment and provides faster and additional cooling beyond systems utilizing only single cooling path, such as a solid thermal component.

Further, to switch the persistent current switch system 70, and more particularly, the winding unit 14, from the normal state to the superconducting state, a heating unit (not shown) is de-energized or turned OFF and the first and second cooling tubes 72, 74 are filled with the coolant 28 received from the reservoir 18. The coolant 28 is circulated in the first and second cooling tubes 72,74 to maintain or reduce the temperature of the winding unit 14 below the threshold temperature or the critical temperature. If the temperature of the winding unit 14 is below the threshold temperature, the winding unit 14 switches from the normal state to the superconducting state. The superconducting state is representative of a state where the winding unit 14 provides zero resistance to the superconducting magnet. This zero resistance of the winding unit 14 helps to form a persistent loop with electric current circulating between the winding unit 14 and the superconducting magnet, without any current supply from a power source (not shown in FIG. 3).

Typically, the persistent current switch systems 10, 60, 70 of FIGS. 1-3 will operate in the superconducting state if the temperature of the winding unit 14 is below the threshold temperature. The persistent current switch systems 10, 60, 70 are switched to the normal state in certain situations. For example, it may be desirable to switch the persistent current switch systems 10, 60, 70 to the normal state in case of an event of having to ramp down the magnet. To switch the winding unit 14 from the superconducting state to the normal state, the flow control component 38 disposed in fluid communication with a cooling tube is closed. Particularly, the flow control component 38 is closed to choke or reduce the in-flow of coolant 28 from the reservoir 18 to the cooling tube(s), and also to prevent the back-flow of the coolant 28 from the cooling tube(s) to the reservoir 18. In addition, an optional heating unit (not shown) is energized or turned ON to heat the winding unit 14. By heating the winding unit 14, the temperature of the winding unit 14 is enhanced or increased above the threshold temperature, which causes the winding unit 14 to transition from the superconducting state to the normal state. This transition of the persistent current switch systems 10, 60, 70 to the normal state causes the magnetic device, such as a magnetic coil to switch for de-energizing the magnet.

The evaporated coolant is conveyed out of the cooling tube(s) to the reservoir 18 via the recondenser 46. Further, the evaporated coolant is re-condensed and stored in the reservoir 18. During the switching of the persistent current switch system 10, 60, 70, and more particularly, the winding unit 14, from the normal state to the superconducting state, this re-condensed coolant is circulated back to the cooling tube(s) 26, 72, 74. The persistent current switches 616 are operatively coupled to the superconducting MRI magnet 602.

Figure 4:
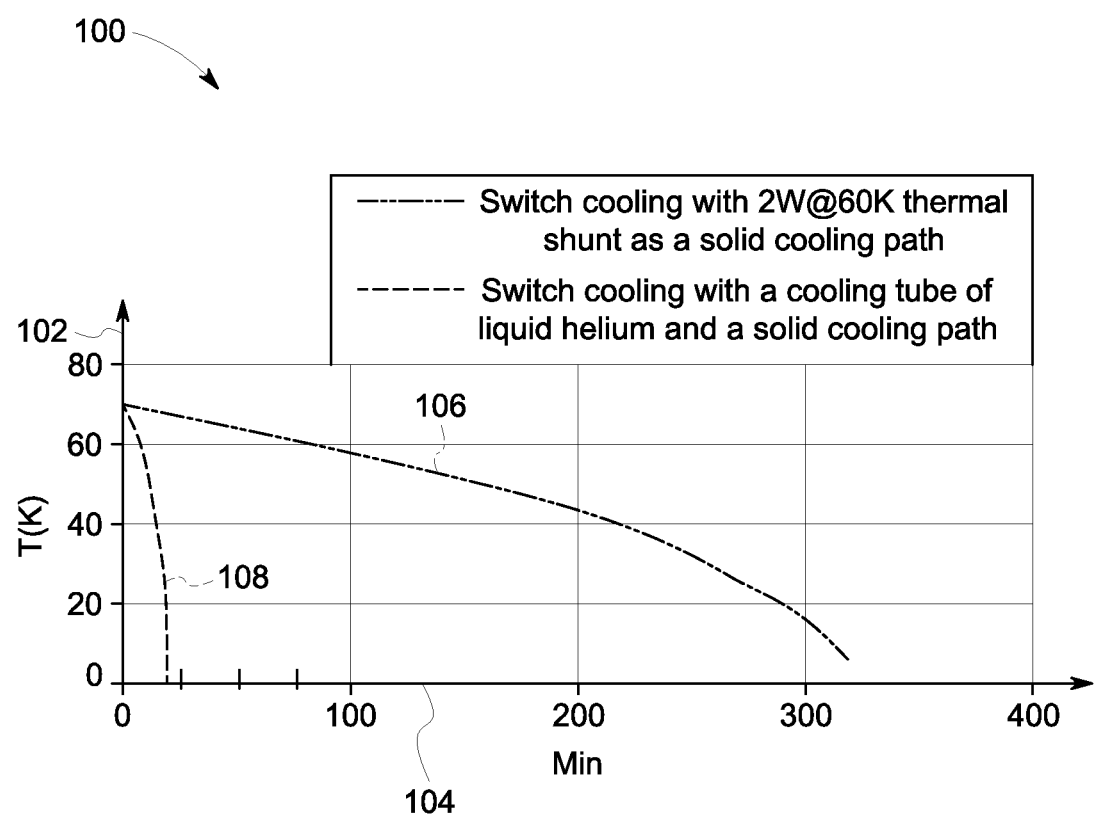
FIG. 4 is a graphical comparison of a persistent current switch cooling system utilizing a solid cooling path versus a persistent current switch system utilizing dual cooling paths in accordance with one or more embodiments of the present disclosure.

Referring now to FIG. 4, illustrated in an exemplary graphical representation, generally referenced 100, are comparative cooling times achieved between a known persistent switch system using a solid thermal component for direct cooling and a persistent current switch system including dual cooling paths, in accordance with an exemplary embodiment. More specifically, graph 100 illustrates temperature (K) (plotted in y-axis 102) with time (plotted in x-axis 104) of a known persistent current switch system utilizing cooling with 2W@60K thermal shunt as a solid cooling path (shown by plotted line 106) as compared to a persistent current switch system utilizing dual cooling paths, and more particularly, a first cooling path comprising a solid thermal component directly connected to the winding unit to define a solid cooling path and a second cooling path comprising a cooling tube of liquid helium directly connected to the winding unit, as disclosed herein (shown by plotted line 108).

As graphically evidenced, the switch cooling time could be reduced from approximately 300 minutes for the conventional persistent current switch system to approximately 20 minutes for the novel persistent current switch system including dual cooling paths as disclosed herein. A reduction in time for switch cooling is achieved with the use of dual cooling paths.

Figure 5:
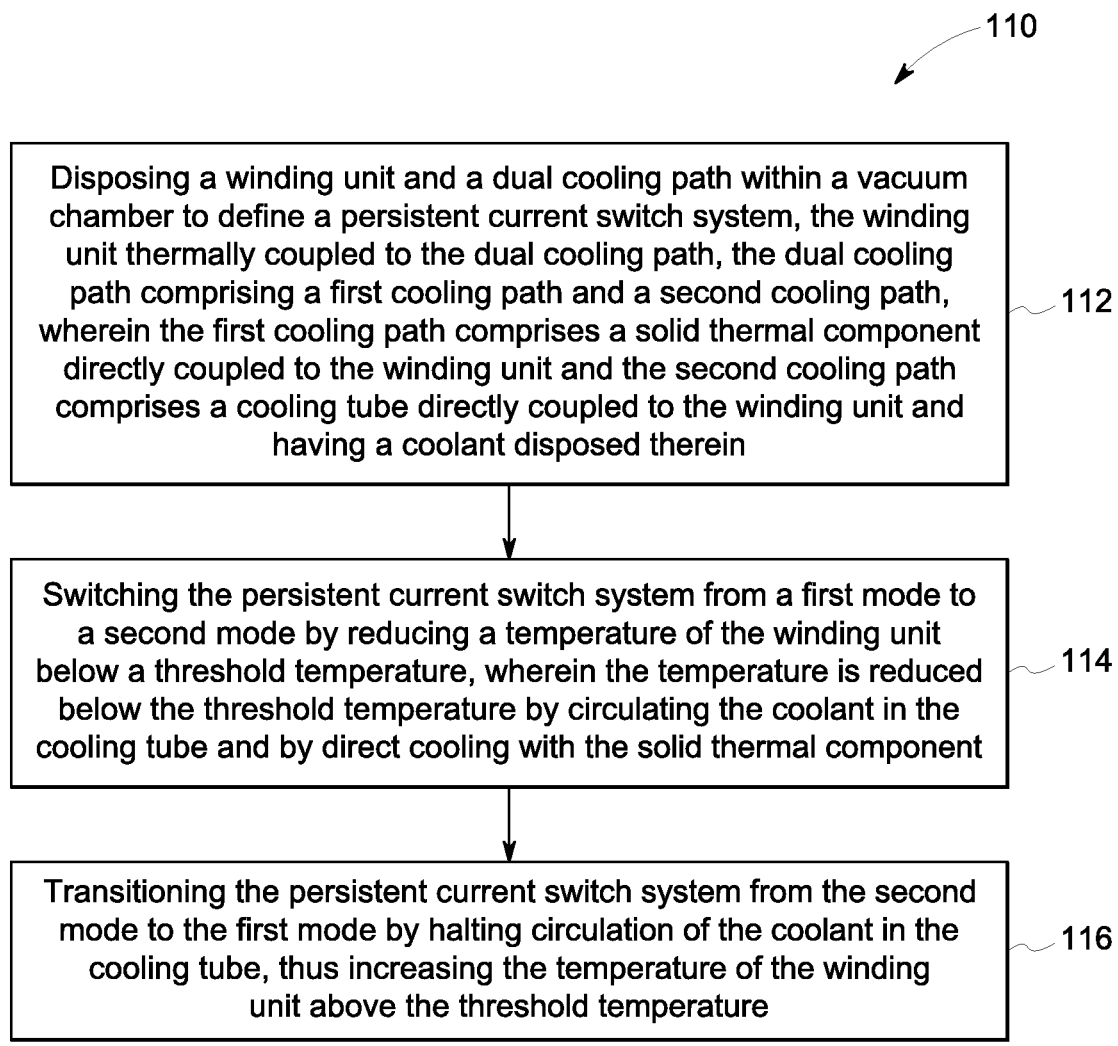
FIG. 5 is a flow chart illustrating a method for alternatingly switching the persistent current switch including dual cooling paths between a first mode or normal state and a second mode or superconducting state, in accordance with one or more embodiments of the present disclosure.

Referring to FIG. 5, a flow chart 110 illustrating a method for alternatingly switching a winding unit between a first mode or normal state and a second mode of superconducting state using dual cooling paths, such as the persistent current switch system 10 of FIG. 1, in accordance with aspects of the present technique, is depicted. For ease of understanding of the present technique, the method is described with reference to the components of FIG. 1. It may be noted that the first mode is representative of a normal state, while the second mode is representative of a superconducting state of the persistent current switch. Also, in the normal state, the persistent current switch provides high electrical resistance to a current flowing in the associated magnetic device. However, in the superconducting state, the persistent current switch winding unit 14 provides zero resistance to the current flowing in the magnetic device.

The method begins at a step 112, where dual cooling paths, such as the dual cooling paths 16 of FIG. 1, and more particularly, the first cooling path 20 and the second cooling path 22 of FIG. 1, and a winding unit, such as the winding unit 14 of FIG. 1 are disposed within a vacuum chamber, such as the vacuum chamber 12 of FIG. 1. Particularly, the dual cooling paths are disposed within the vacuum chamber in a manner to provide the first cooling path, and more particularly, a solid thermal component, such as the solid thermal component 24 of FIG. 1, to be in direct contact with the winding unit and a cooling tube, such as cooling tube 26 of FIG. 1, and provide the second cooling path, and more particularly the cooling tube to be in direct contact with the winding unit. In one embodiment, the first cooling path and the second cooling path utilize a single cooling tube. The cooling tube includes an inlet and an outlet, such as inlet 30 and outlet 32 of FIG. 1. The inlet is operatively coupled to an outlet of the reservoir, such as outlet 34 of reservoir 18 of FIG. 1, via a channel, such as channel 36 of FIG. 1, defined therein the cooling tube. Similarly, the outlet of the cooling tube is operatively coupled to an inlet of the reservoir, such as inlet 54 of FIG. 1, via a recondenser, such as recondenser 46 of FIG. 1. In another embodiment, the first cooling path and the second cooling path utilize separate cooling tubes, and more particularly, a first cooling tube, such as the first cooling tube 72 of FIG. 3, and a second cooling tube, such as the second cooling tube 74 of FIG. 3, respectively.

Subsequently, the cooling tube circulates a coolant, such as coolant 28 of FIG. 1, to remove heat from the winding unit absorbed by the solid thermal component and directly from the winding unit. Since the cooling tube is coupled to the reservoir, the coolant is initially received from the reservoir and circulated in the cooling tube to absorb heat generated by the winding unit, which in turn reduces a temperature of the winding unit. In one embodiment, the coolant is received from the reservoir when a heating unit is de-energized or turned OFF and at least a portion of the coolant is evaporated.

Further, at step 114, the persistent current switch, and more particularly, the winding unit, is switched from the first mode or normal state to the second mode or superconducting state by reducing the temperature of the winding unit below the threshold temperature. The temperature of the winding unit is reduced below the threshold temperature by circulating the coolant in the cooling tube in contact with the winding unit and by direct cooling the winding unit with the solid thermal component. Particularly, the coolant circulating in the cooling tube may be employed to absorb the heat generated by the winding unit via the dual cooling paths, thereby cooling the winding unit. Absorption of the heat by the coolant results in dropping the temperature of the winding unit below the threshold temperature. Consequent to the drop in temperature below the threshold temperature, the persistent current switch is switched from the normal state or first mode to the superconducting state or second mode. In addition, during the process of cooling the temperature of the winding unit, a portion of the coolant in the cooling tube may be evaporated. More specifically, the heat generated by the winding unit is absorbed by the coolant in the cooling tube, which is turn evaporates the coolant. The evaporated coolant is then conveyed out of the cooling tube via the outlet of the cooling tube. Further, the evaporated coolant is conveyed to the reservoir via recondenser. At the recondenser, the evaporated coolant is re-condensed to liquid coolant and conveyed back to the reservoir.

Additionally, at step 116, circulation of the coolant in the cooling tube is halted, thus increasing the temperature of the winding unit to a temperature above the threshold temperature. By increasing the temperature above the threshold temperature, the persistent current switch system is transitioned from the second mode to the first mode. Initially, while operating the persistent current switch system in the superconducting state or the second mode, the temperature of the winding unit is maintained below the threshold temperature utilizing the dual cooling paths, and more particularly the first cooling path and the second cooling path. Subsequently, to transition the persistent current switch system from the superconducting state to the normal state, the temperature of the winding unit is allowed to increase above the threshold temperature. To enhance or increase the temperature, an optional heating unit may be employed to heat the winding unit. Thus, by employing the above method, the persistent current switch system is alternatingly switched between the first mode and the second mode in a manner that reduces the switch cooling time from that of a single cooling path, typically employing a single solid thermal component.

Thus, various embodiments provide a persistent current switch, and more particularly, a persistent current switch system, that is cooled utilizing dual cooling paths, whereby a solid thermal component directly connected to the winding unit at a first end, and a cooling tube at a second end provides for cooling along a first cooling path and the cooling tube directly connected to the winding unit provides for cooling along a second cooling path. Moreover, implementation in a superconducting system, provides for a reduction in the time required to cool the winding unit below the threshold temperature and a reduction in the magnet weight by eliminating a large liquid He storage vessel that is typically used in superconducting magnets and recirculating the liquid He as the coolant. In various embodiments, no servicing or adding of cryogen is needed and the overall system weight may be reduced.

The system and the method for utilizing dual cooling paths to alternatingly switch the system, and more particularly, the winding unit, described hereinabove aid in reducing the required switching time, as well as manufacture cost and weight of magnetic device. In addition, a reduction of preparation/lead time for functioning of the system and reduction of the thermal instability of the system may be achieved. As a result, labor for preparation and system maintenance may be reduced, operation rate for the system may be increased, and system reliability may be increased. Also, since the evaporated coolant is re-condensed and circulated back to the cooling unit of the persistent current switch system, use of thousands of liters of coolant or liquid He in the reservoir or storage vessel may be prevented. Moreover, the arrangement of the present technique provides a very quick response time, such as the quick cool down time, for the persistent current switch.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system, comprising:
 a vacuum chamber;
 a switch consisting of a winding unit, the winding unit consisting of a wire wound around a bobbin, the winding unit disposed in the vacuum chamber and configured to switch from a resistive state in a first mode to a superconducting state in a second mode when a temperature associated with the winding unit is below a threshold temperature;

a first cooling path comprising a solid thermal component in direct contact with the winding unit and a second cooling path comprising a cooling tube with a coolant circulating therethrough disposed in direct contact with the winding unit, the first cooling path and the second cooling path defining dual cooling paths to cool the temperature of the winding unit below the threshold temperature to transition the winding unit from the first mode to the second mode; and wherein the first cooling path and the second cooling path are configured to operate simultaneously to jointly cool the temperature of the winding unit.

2. The system as claimed in claim 1, further comprising a flow control component disposed to control a flow of the coolant in the cooling tube.

3. The system as claimed in claim 2, wherein the flow control component is a cryogenic valve.

4. The system as claimed in claim 3, wherein the cryogenic valve is a latching valve.

5. The system as claimed in claim 2, wherein the flow control component is an orifice flow restrictor.

6. The system as claimed in claim 1, further comprising at least one of a buffer mass and an evaporated gas buffer tank disposed to absorb heat in the coolant.

7. The system as claimed in claim 1, wherein the cooling tube circulates the coolant in the cooling tube to absorb heat generated by the winding unit.

8. The system as claimed in claim 1, wherein the solid thermal component comprises one of a thermally conductive metal rod, a thermally conductive metal sheet and thermally conductive metal bar, in direct contact with each of the winding unit and the cooling tube.

9. The system as claimed in claim 1, further comprising an additional cooling tube disposed in direct contact with the solid thermal component and configured to circulate a coolant therein.

10. The system as claimed in claim 1, wherein the cooling tube comprises:

an inlet coupled to a coolant reservoir and configured to receive the coolant from the coolant reservoir; and an outlet coupled to the coolant reservoir and configured to convey evaporated coolant from the cooling tube to the coolant reservoir.

11. The system as claimed in claim 10, wherein the inlet is configured to receive the coolant from the coolant reservoir when the winding unit is above the threshold temperature and wherein the outlet is configured to convey the evaporated coolant to the coolant reservoir.

12. The system as claimed in claim 1, wherein the coolant comprises at least one of liquid helium (LHe), liquid hydrogen ($LH_2$), liquid neon (LNe), and liquid nitrogen ($LN_2$).

13. A system, comprising:

the system with a cooled persistent current switch in accordance with claim 1; and a superconducting magnet coupled to the persistent current switch, wherein the superconducting magnet is configured to generate a magnetic field based on the switching of the persistent current switch between the first mode and the second mode.

14. The system as claimed in claim 13, further comprising a flow control component disposed to control a flow of the coolant in the cooling tube.

15. The switching system as claimed in claim 13, wherein the solid thermal component and the winding unit are each in thermal communication with the coolant tube to absorb heat generated by the winding unit.

* * * * *